(12) United States Patent
Kang et al.

(10) Patent No.: US 10,110,174 B2
(45) Date of Patent: Oct. 23, 2018

(54) ADAPTIVE POWER AMPLIFIER AND RADIO FREQUENCY TRANSMITTER THEREOF

(71) Applicant: FCI INC., Seongnam-si (KR)

(72) Inventors: Min-Chul Kang, Seongnam-si (KR); Myung-Woon Hwang, Seongnam-si (KR)

(73) Assignee: FCI INC., Seongnam-si (KR)

( * ) Notice: Subject to any disclaimer, the term of this patent is extended or adjusted under 35 U.S.C. 154(b) by 0 days.

(21) Appl. No.: 15/485,806

(22) Filed: Apr. 12, 2017

(65) Prior Publication Data

US 2017/0294885 A1    Oct. 12, 2017

(30) Foreign Application Priority Data

Apr. 12, 2016  (KR) .................. 10-2016-0045001

(51) Int. Cl.
| | |
|---|---|
| *H04B 1/04* | (2006.01) |
| *H03F 1/32* | (2006.01) |
| *H03F 1/02* | (2006.01) |
| *H03F 1/22* | (2006.01) |
| *H03F 1/56* | (2006.01) |

(Continued)

(52) U.S. Cl.
CPC ......... *H03F 1/3241* (2013.01); *H03F 1/0227* (2013.01); *H03F 1/223* (2013.01); *H03F 1/56* (2013.01); *H03F 3/193* (2013.01); *H03F 3/245* (2013.01); *H03F 3/45179* (2013.01); *H04B 1/04* (2013.01); *H03F 2200/165* (2013.01); *H03F 2200/222* (2013.01); *H03F 2200/333* (2013.01); *H03F 2200/387* (2013.01); *H03F 2200/451* (2013.01); *H03F 2203/45394* (2013.01); *H04B 2001/0425* (2013.01)

(58) Field of Classification Search
CPC ...... H03F 1/3242; H03F 1/0227; H03F 1/223; H03F 1/56; H03F 3/193; H03F 3/245
See application file for complete search history.

(56) References Cited

U.S. PATENT DOCUMENTS

| | | | |
|---|---|---|---|
| 2006/0053321 A1* | 3/2006 | Mizusawa ............ | H04B 1/0458 713/300 |
| 2007/0285175 A1* | 12/2007 | Oh ........................ | H03F 1/223 330/311 |

(Continued)

*Primary Examiner* — Tuan Pham
(74) *Attorney, Agent, or Firm* — Kirton McConkie; Evan R. Witt

(57) ABSTRACT

An adaptive power amplifier and a radio frequency transmitter thereof are described. The radio frequency transmitter is a transmitter to transmit a transmission signal for a wireless communication system. The radio frequency transmitter includes at least one direct-current (DC) to direct-current (DC) converter coupled to an external power supply device for operation, a digital-to-analog converter configured to convert a digital signal into an analog signal, a filter configured to filter a harmonic component of the analog signal to generate an input signal, a RF up-converter configured to up-convert the input signal according to a desired channel frequency for generating a modulated signal, and a power amplifying circuit coupled to the DC-to-DC converter and the external power supply device, for selectively receiving one of different supply voltages for operation, and amplifying the modulated signal to generate a RF output signal.

14 Claims, 7 Drawing Sheets

(51) Int. Cl.
*H03F 3/45* (2006.01)
*H03F 3/24* (2006.01)
*H03F 3/193* (2006.01)

(56) References Cited

U.S. PATENT DOCUMENTS

| | | | |
|---|---|---|---|
| 2011/0070848 A1* | 3/2011 | Ramachandra Reddy | .................. H03F 1/0227 455/127.2 |
| 2011/0210795 A1* | 9/2011 | Ohta | ..................... H03F 1/0266 330/288 |
| 2014/0220915 A1* | 8/2014 | Mo | ......................... H03F 1/223 455/127.3 |
| 2016/0094186 A1* | 3/2016 | Cohen | ................... H03F 1/0233 330/297 |

* cited by examiner

ADAPTIVE POWER AMPLIFIER AND RADIO FREQUENCY TRANSMITTER THEREOF

BACKGROUND OF THE INVENTION

Field of Invention

The present invention relates to a technical field of an adaptive power amplifier and a radio frequency transmitter, and more particularly relates to an adaptive power amplifier and a radio frequency transmitter thereof corresponding to a plurality of different supply voltages.

Description of Prior Art

Some content described in this section simply provides the background of the present invention, and is not deemed as a prior art.

The transceiver used in a wireless communication device, such as a cellular phone (e.g., cellular handset) or wireless network (e.g., WIFI protocol) includes the advantages of a low-power, low-cost, a miniaturized feature, a high output rate, and the like. In order to realize miniaturization in a transceiver with a low cost, a complementary-metal-oxide semiconductor (CMOS) manufacturing process is adopted, and the external components are embedded within the main radio frequency chip. Recently, in order to improve performance of power amplifiers, the power amplifiers may also be integrated properly.

In a conventional transmission system of a power amplifier, when the output power levels required on the transmission system are different, the other device must be used instead of the power amplifier. In addition, if the power amplifier is integrated to the transmitter, the integrated system can not reflect changed output level. When the output power of the transmitter is insufficient, it is required to use additional power amplifier in the external portion. On the contrary, if the output power of the transmitter is larger, it may cause excessive current consumption.

In the conventional technology, the above-described problem is handled by an envelope tracking to a power amplifier or a supply switch system. In this manner, since a function of the integrated chip must include a controllable supply switch, thus, the hardware structure is more complex and the linearization of the transmitted signal is degraded. In order to solve the above problem of poor, a linearization device such as digital pre-distortion (DPD) has to be prepared. In particular, because of the increased size of the entire chip area due to excessive concentration, thus, the cost is increased.

SUMMARY OF THE INVENTION

Problem to be Solved by the Present Invention

In order to solve the above-mentioned problem, the present invention provides an adaptive power amplifier and a radio frequency transmitter thereof including a power amplifying circuit for adjusting the maximum output power, i.e., a saturation power, and for maintaining a better linear characteristic based on a plurality of corresponding supply voltages even if there is no variable switch.

Means for Solving the Problems

In one embodiment, the present invention provides a radio frequency (RF) transmitter which is a transmitter to transmit a transmission signal for a wireless communication system. The radio frequency transmitter includes at least one direct-current (DC) to direct-current (DC) converter coupled to an external power supply device for operation; a digital-to-analog converter configured to convert a digital signal into an analog signal; a filter configured to filter a harmonic component of the analog signal to generate an input signal; a RF up-converter configured to up-convert the input signal according to a desired channel frequency for generating a modulated signal; and a power amplifying circuit coupled to the DC-to-DC converter and the external power supply device and configured to selectively receive one of different supply voltages for operation for amplifying the modulated signal to generate a RF output signal.

In one embodiment, the power amplifying circuit comprises a power amplifier having a cascode transistor structure; a controllable bias circuit coupled to the cascode transistor structure of the power amplifier; an input matching circuit configured to match an input terminal of the power amplifier to an input signal terminal; and an output matching circuit configured to match an output terminal of the power amplifier to an output signal terminal.

In one embodiment, the power amplifying circuit further comprises a power amplifier control circuit configured to control the power amplifying circuit based on different supply voltages.

In one embodiment, a plurality of transistors of the power amplifier are coupled to a main transistor via the cascode transistor structure.

In one embodiment, the power amplifying circuit adjusts the controllable bias circuit based on the different supply voltages.

In one embodiment, the power amplifying circuit adjusts the controllable bias circuit based on the different supply voltages to adjust a turn on number of transistors of the cascode transistor structure.

In one embodiment, the power amplifying circuit change resistances of the input matching circuit and the output matching circuit based on the different supply voltages.

In one embodiment, the power amplifier comprises a differential amplifier structure.

In one embodiment, the power amplifying circuit is coupled to a plurality of DC-to-DC converters for operation to selectively applying one of the received different supply voltages.

In one embodiment, the power amplifying circuit is coupled to the DC-to-DC converter having controllable output values to selectively applying one of the received different supply voltages.

In one embodiment, the power amplifying circuit and the DC-to-DC converter are integrated in the radio frequency transmitter.

In one embodiment, the present invention provides an adaptive power amplifier coupled to at least one direct-current (DC) to direct-current (DC) converter in a radio frequency (RF) transmitter and coupled to an external power supply device for selectively receiving one of different supply voltages for operation. The adaptive power amplifier comprises a power amplifier having a cascode transistor structure; a controllable bias circuit coupled to the cascode transistor structure of the power amplifier; an input matching circuit configured to match an input terminal of the power amplifier to an input signal terminal; and an output matching circuit configured to match an output terminal of the power amplifier to an output signal terminal.

In one embodiment, the controllable bias circuit adjusts the cascode transistor structure based on the different supply voltages.

In one embodiment, the controllable bias circuit adjusts the cascode transistor structure based on the different supply voltages to adjust a turn on number of transistors of the cascode transistor structure.

In one embodiment, the input matching circuit and the output matching circuit changes resistances based on the different supply voltages.

In one embodiment, the power amplifier comprises a differential amplifier structure.

Effect

In view of the aforementioned descriptions, one embodiment of the present invention has the following effects. A radio frequency transmitter corresponds a plurality of supply voltages and selectively applies the supply voltages so that the transmitter release the maximum output power based on the supply voltages.

Furthermore, the input matching circuit and the output matching circuit changes resistances based on the different supply voltages so that the power amplifier operates based on corresponding supply voltage in a high efficiency and linear characteristic.

DETAILED DESCRIPTION OF THE PREFERRED EMBODIMENTS

The following embodiments with reference to the accompanying drawings and the detail of a partial embodiment of the present invention will be described. It is noted that the constituent elements shown in the figures marked with reference symbols can be as closely as possible to the same constituent elements denoted by common symbols even though the constituent elements are shown in different figures. In addition, while describing the present invention, if the determination is a well known specific description form or function and may make the subject matter of the present invention obscure, detailed descriptions thereof are omitted.

In addition, when the constituent elements of the present invention will be described, the terms of first, second, A, B, (a), (b), etc. are used. Such terms are only used to distinguish one component from other components, and do not limit the nature, an order or sequence of the respective constituent elements. throughout the specification, when it is indicated that a certain portion of the "comprising", "having" means a certain constituent element, as long as not specifically described otherwise, it means that does not exclude the presence of other components, but may also include other components. In addition, the description of "portion", a "module" and the like refer to at least one function or action processing unit, it may be implemented by hardware, software, or a combination of hardware and software.

A general power amplifier corresponds a maximum output power of a supply voltage. Thus, for the case of using the power amplifier, a matched supply voltage must be applied to a power amplifier. For the different cases of supplying different voltages to the general power amplifier, the maximum output power, efficiency and the linear property are reduced. In particular, for a complementary metal-oxide (CMOS) power amplifier, in comparison to the power amplifier with different manufacturing processes, it is required to use a linearization device of a digital pre-distortion (DPD) in order to get a better linear characteristic of a transmitting device due to the relatively reduced linear characteristics.

One embodiment of the present invention discloses an adaptive power amplifier. When the supply voltage becomes larger, the maximum output power is increased. When the supply voltage becomes smaller, the change in power efficiency becomes good. Even if no linearization device is used, the adaptive power amplifier linearly operates also according to different supply voltages. Furthermore, at least one embodiment of the present invention discloses a radio frequency transmitter including a power amplifier therein. In a system with a high power output, even if an external power amplifier is omitted, a single transmitter is able to generate larger power output.

Figure 1A:
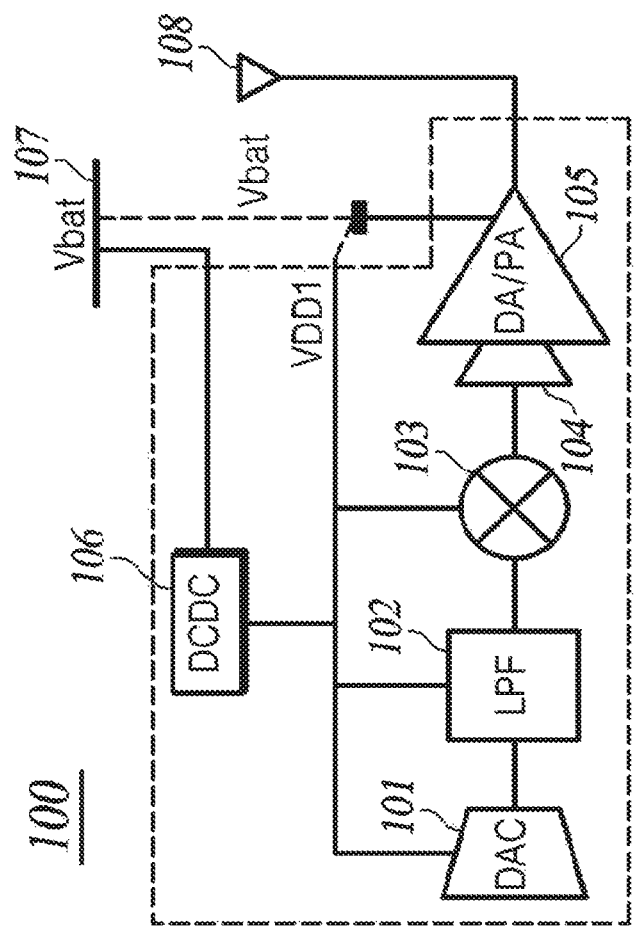
FIG. 1(a) through FIG. 1(c) are schematic block diagrams of a radio frequency transmitter according to one embodiment of the present invention.
Figure 1B:
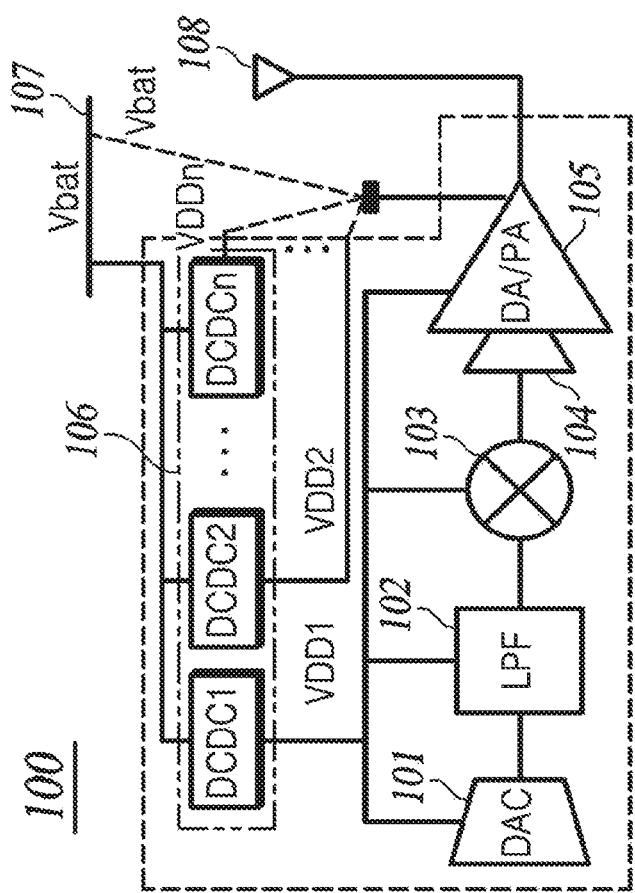
Figure 1C:
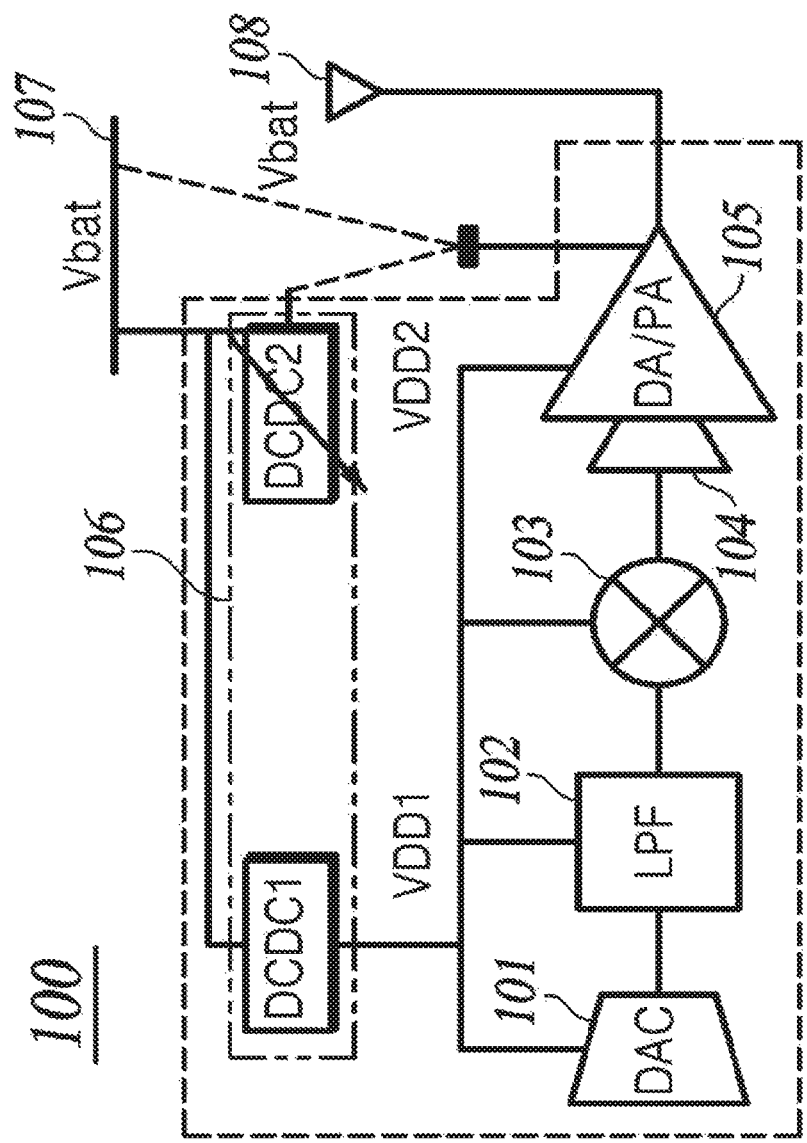

FIG. 1(a) through FIG. 1(c) are schematic block diagrams of a radio frequency transmitter according to one embodiment of the present invention.

FIG. 1(a) shows a power amplifier connecting to one DC-to-DC (direct-current to direct-current) transformer in a radio frequency transmitter. In one embodiment of FIG. 1(a), the radio frequency transmitter 100 includes a digital-to-analog converter (DAC) 101, a filter 102 (e.g., a low pass filter (LPF)), a RF up-converter 103, a driving amplifier (DA) 104, a power amplifying circuit (DA/PA) 105, and a DC-to-DC converter 106, where the radio frequency transmitter 100 is coupled to an external power supply device (Vbat) 107 and an antenna 108 for operation.

The digital-to-analog converter 101 is configured to convert an input digital signal into an analog signal.

The filter 102 including a low-pass filter is configured to filter noise of a transmission signal. In other words, the filter 102 receives the analog signal from the digital-to-analog converter 101 and filters a harmonic component of the analog signal to provide a baseband signal as an input signal.

The RF up-converter 103 up-converts the input signal passing through the filter 102 according to a desired channel frequency for generating a modulated signal.

The driving amplifier 104 is configured to gain and amplify the modulated signal.

The power amplifying circuit 105 receives a power supply source from the DC-to-DC converter (having a VDD1 level) 106 and the external power supply device 107 for gaining and amplifying the power of the modulated signal to generate a power amplified RF output signal. The power amplified RF output signal is transmitted via the antenna 108.

The digital-to-analog converter 101, the filter 102, the RF up-converter 103, the driving amplifier 104, the power amplifying circuit 105 and the DC-to-DC converter 106 can be integrated in a radio frequency transmitter. In one embodiment of the present invention, a power amplifier of a radio frequency transmitter produces a maximum power output and performs a linear operation. Accordingly, the radio frequency transmitter can produces the maximum power output via a single transmitter in different supply voltages even if there is no external linear device power amplifier.

FIG. 1(b) shows a power amplifier connecting to a plurality of DC-to-DC (direct-current to direct-current) converters in a radio frequency transmitter. FIG. 1(c) shows a radio frequency transmitter where an internal power amplifier is coupled to the DC-to-DC converters having controllable output values.

According to one embodiment of the present invention, the power amplifying circuit 105 is an adaptive power amplifier which selectively receives the supply voltages from the DC-to-DC converter 106 within the transmitter and an external power supply device 107 connected to transmitter so that the adaptive power amplifier operates based on the different supply voltages. The power amplifying circuit 105 is coupled to a plurality of DC-to-DC converters 106 including a DC-to-DC converter DCDC1 having VDD1 level, a DC-to-DC converter DCDC2 having VDD2 level, and a DC-to-DC converter DCDCn having VDDn level. As shown in FIG. 1(c), the power amplifying circuit 105 is coupled to a plurality of DC-to-DC converters 106 having controllable output values including a DC-to-DC converter DCDC1 having VDD1 level, and a DC-to-DC converter DCDC2 having VDD2 level. In one embodiment, the power amplifier 105 determines a corresponding radio frequency transmitter based on the supply voltages and decides an overall maximum power output of the radio frequency transmitter 100. In other words, the power amplifying circuit 105 corresponds to different supply voltages according to the high-efficiency operation and provides a linear output signal so that the radio frequency transmitter 100 can operate according to the determined supply voltage to release the maximum output power.

Figure 2:
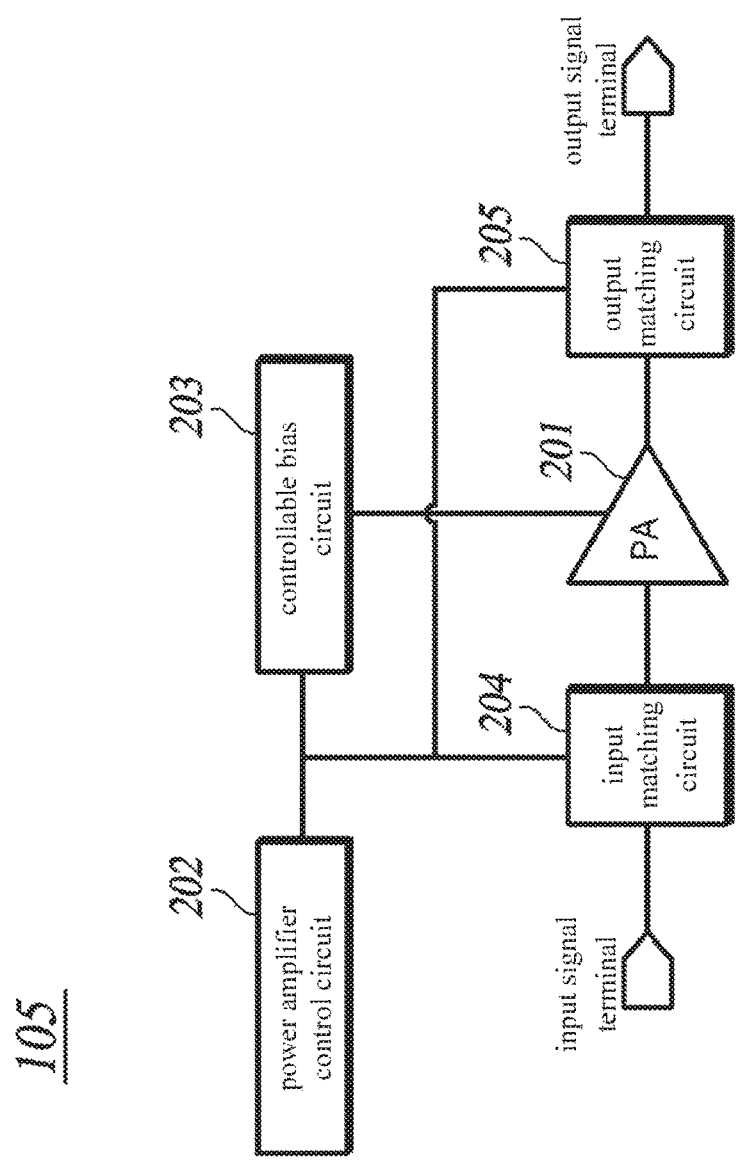
FIG. 2 is a schematic functional block diagram of main constituent elements in a power amplifier according to one embodiment of the present invention.

FIG. 2 is a schematic functional block diagram of main constituent elements in a power amplifier according to one embodiment of the present invention. The power amplification circuit 105 in the radio frequency transmitter 100 includes a power amplifier (PA) 201, a power amplifier control circuit 202, a controllable bias circuit 203, an input matching circuit 204 and an output matching circuit 205.

The power amplifier 201 is configured to amplify a signal of the input matching circuit 204, where the amplified signal passes through the output matching circuit 205 to be supplied to the load. In one embodiment of the present invention, the power amplifier 201 may be either a single-ended amplifier or a differential amplifier structure.

The power amplifier control circuit 202 generates a control signal based on different supply voltages to control the controllable bias circuit 203, the input matching circuit 204 and the output matching circuit 205 for operation so that the power amplifier 201 releases the maximum output power via the output matching circuit 205.

The controllable bias circuit 203 is configured to supply a bias power supply (e.g., bias voltage or bias current) to the power amplifier 201. In other words, the controllable bias circuit 203 adjusts the bias power supply of the power amplifier 201 so that the power amplifying circuit 105 releases the maximum output power based on different supply voltages.

Furthermore, the controllable bias circuit 203 is configured to adjust the turn on number of the common-emitter and common-base transistors on the power amplifying circuit 105 having a common-emitter and common-base structure, i.e., cascode transistor structure, so that the power amplifying circuit 105 releases the maximum output power based on different supply voltages.

The input matching circuit 204 is coupled between the input signal terminal (in) having an input signal and an input terminal of the power amplifier 201 so that the resistance of an input signal portion (not shown) of the input signal terminal (in) is matched with a resistance of the input terminal of the power amplifier 201. The power amplifier control circuit 202 generates a control signal based on different supply voltages for controlling the input matching circuit 204, and the input matching circuit 204 is configured to adjust and change the resistance structure of the input matching circuit 204 based on the control signal for matching the resistance of a signal path between the input signal terminal (in) and the power amplifier 201.

The output matching circuit 205 is coupled between an output terminal of the power amplifier 201 and the output signal terminal (OUT) having an output signal so that a resistance of the output terminal of the power amplifier 201 is matched with the resistance of the load (not shown). The power amplifier control circuit 202 generates a control signal based on different supply voltages for controlling the output matching circuit 205, and the output matching circuit 205 is configured to adjust and change the resistance structure of the output matching circuit 205 based on the control signal for matching the resistance of a signal path between the power amplifier 201 and the output signal terminal.

In the following, with reference to FIG. 3 to FIG. 5, an adaptive power amplifier in the radio frequency transmitter 100 according to another embodiment of the present invention is described.

Figure 3:
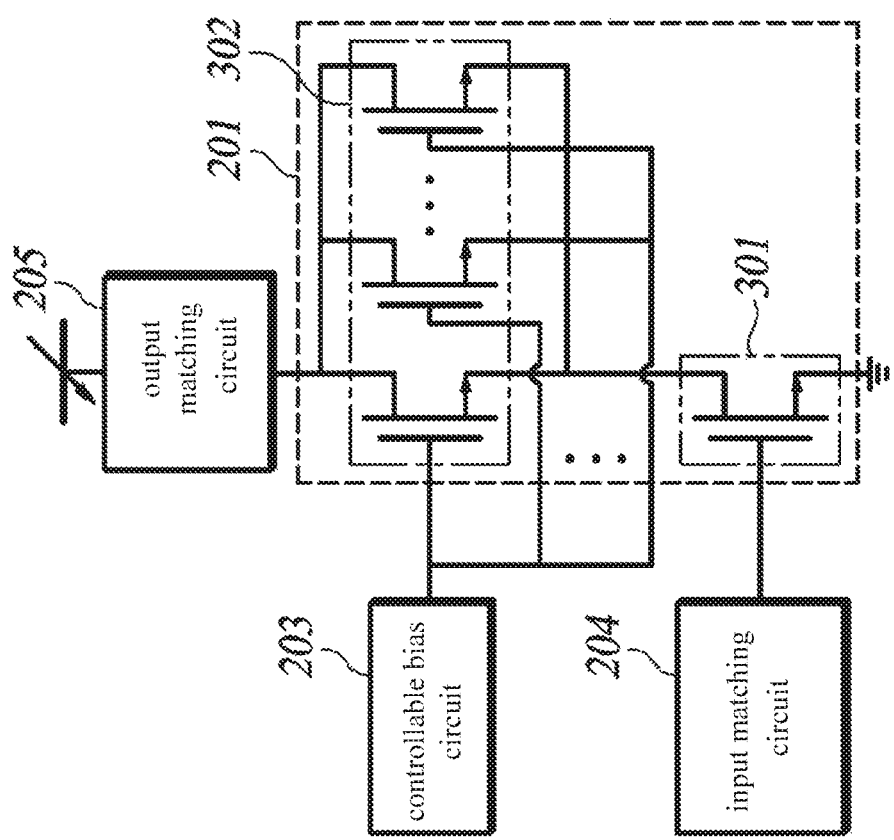
FIG. 3 is a schematic diagram of a controllable bias circuit of an adaptive power amplifier according to one embodiment of the present invention.
Figure 4:
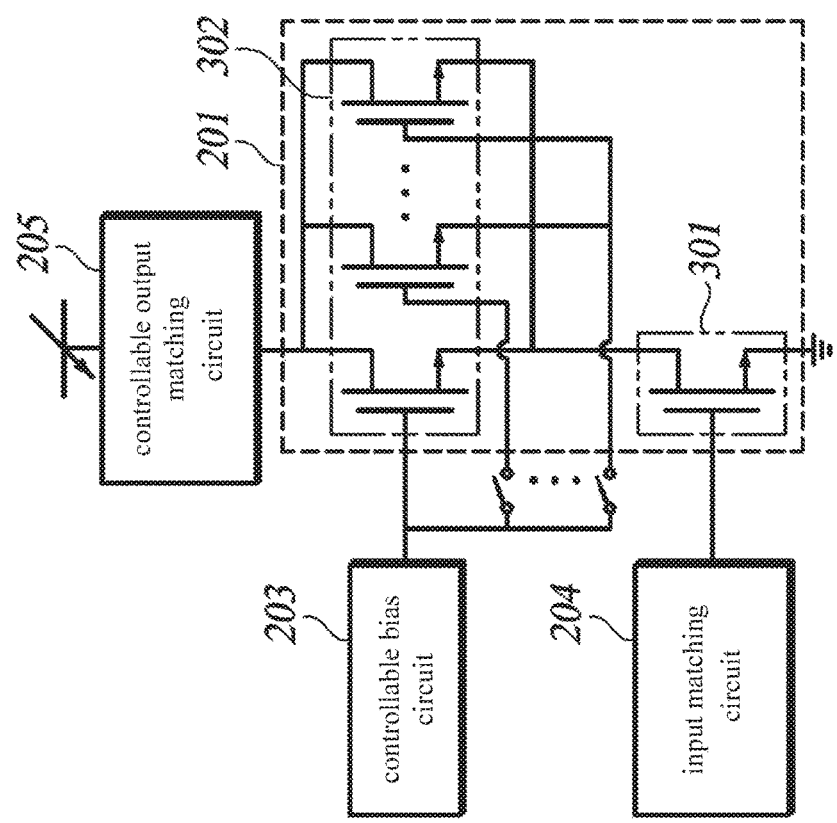
FIG. 4 is a schematic diagram of a controllable bias circuit and a variable resistance circuit of the adaptive power amplifier according to another embodiment of the present invention.
Figure 5:
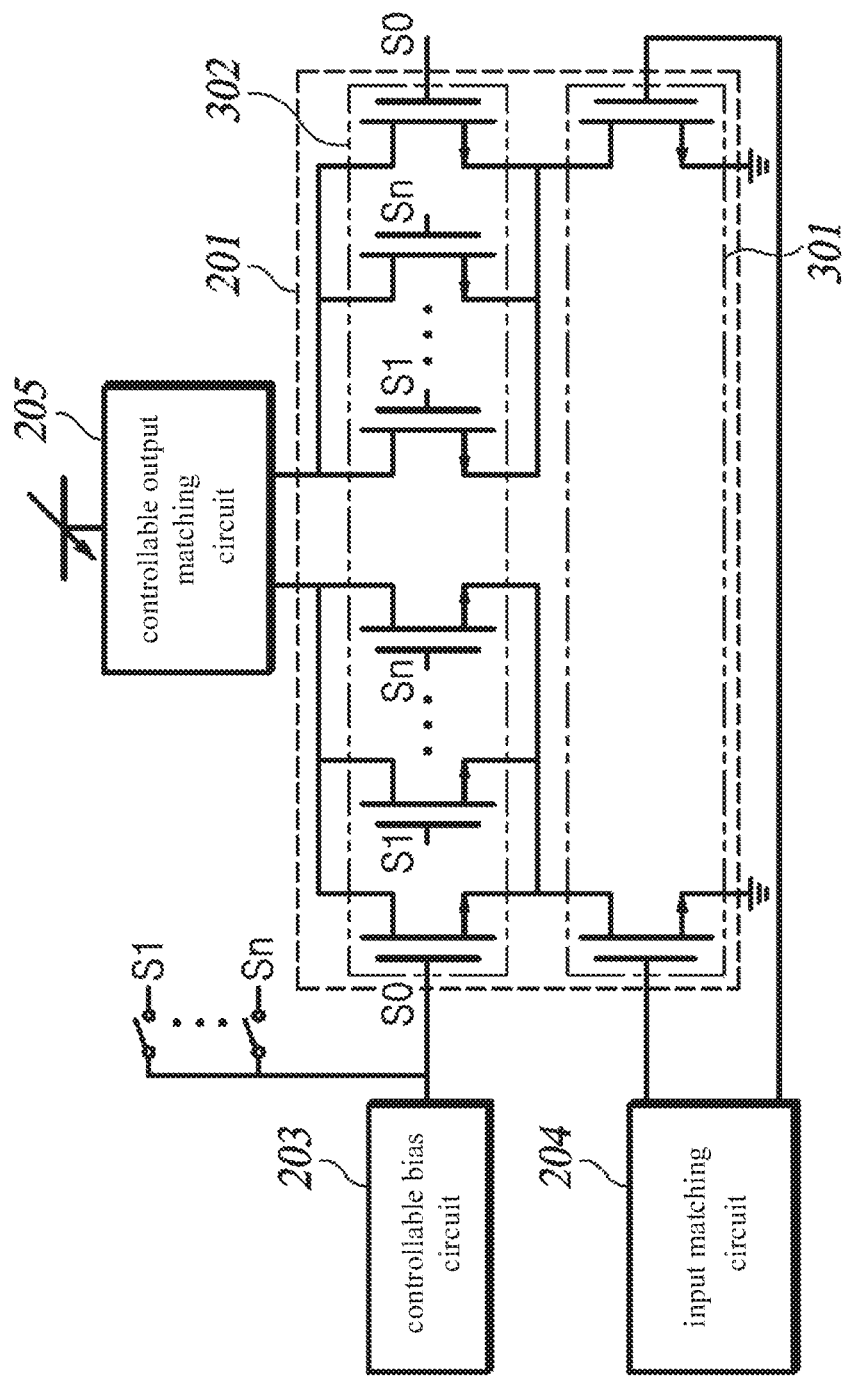
FIG. 5 is a schematic diagram of a differential amplifier structure of the adaptive power amplifier according to another embodiment of the present invention.

An embodiment of the present invention of FIG. 3 to FIG. 5, the input of the power amplifier is composed of an N-type transistor, which is a cascode amplifier structure circuit including common-emitter and common-bases transistors. In FIG. 3 to FIG. 5, a main transistor 301 and a cascode transistor 302 is a cascode amplifier structure circuit by coupling a current lead-in terminal of the main transistor 301 to a current lead-out terminal of the cascode transistor 302. The control terminal of the main transistor 301 is coupled to the input matching circuit 204, and a control terminal of the cascode transistor 302 is coupled to the controllable bias circuit 203. A plurality of cascode transistors 302 is coupled to the main transistor 301 via the cascode amplifier structure circuit so that the cascode transistors 302 correspond to different supply voltages.

The power amplifier of this embodiment is composed of two layers of a cascode transistor structure, but not as a limitation thereof. In another embodiment, the power amplifier may also be formed of multiple layers of connected cascode transistor structures. In addition, a power amplifier circuit in this embodiment utilizes an N-type metal oxide field effect transistor (MOSFET), but can also utilize a P-type transistor or a bipolar junction transistor (BJT) circuit.

FIG. 3 is a schematic diagram of a controllable bias circuit of an adaptive power amplifier according to one embodiment of the present invention.

A power amplifier control circuit 202 generates a control signal based on the supply voltage for control the controllable bias circuit 203. The controllable bias circuit 203 receives the control signal and adjusts the bias power source according to the control signal so that the power amplifying circuit 105 releases the maximum output power based on different supply voltages and performs a linear operation.

FIG. 4 is a schematic diagram of a controllable bias circuit and a variable resistance circuit of the adaptive power amplifier according to another embodiment of the present invention.

The controllable bias circuit 203 receives the control signal from the power amplifier control circuit 202 and adjust the turn on number of the cascode transistor 302 on the power amplifier 201 of a common-emitter and common-base structure based on the control signal. The number of transistors are adjusted according to the on/off switches so that the power amplifying circuit 105 releases the maximum output power based on different supply voltages and performs a linear operation.

Even if the number of transistors which are turned on is changed, and in order to guarantee the operation of the operation frequency, the input matching circuit 204 and the output matching circuit 205 receives a control signal from the power amplifier control circuit 202 for adjusting a resistance on the signal path of the power amplifier 201 according to the control signal. The input matching circuit 204 is able to a resistance of an input signal portion (not shown) of the input signal terminal and a resistance of the input terminal of the power amplifier 201. In addition, the output matching circuit 205 is able to adjust a resistance of an output terminal of the power amplifier 201 and a resistance of the load (not shown).

FIG. 5 is a schematic diagram of a differential amplifier structure of the adaptive power amplifier according to another embodiment of the present invention.

In the adaptive power amplifier of FIG. 5, the power amplifier 201 is a differential amplifier structure rather than a single ended amplifier configuration. Compared to the main transistor 301 in FIG. 3 and FIG. 4, and a cascode transistors (S0~Sn) 302, the main transistor 301 and the cascode transistor 302 in FIG. 5 are controlled by a differential structure, where the operation modes of the controllable bias circuit 203, an input matching circuit 204 and an output matching circuit 205 in FIG. 5 are the same as these in FIG. 3 and FIG. 4.

As is understood by a person skilled in the art, the foregoing preferred embodiments of the present invention are illustrative rather than limiting of the present invention. It is intended that they cover different modifications and similar arrangements be included within the spirit and scope of the present invention, the scope of which should be accorded the broadest interpretation so as to encompass all such modifications and similar structures.

What is claimed is:

1. A radio frequency (RF) transmitter which is a transmitter to transmit a transmission signal for a wireless communication system, the RF transmitter comprising:
   at least one direct-current (DC) to direct-current (DC) converter coupled to an external power supply device for operation;
   a digital-to-analog converter configured to convert a digital signal into an analog signal;
   a filter configured to filter a harmonic component of the analog signal to generate an input signal;
   a RF up-converter configured to up-convert the input signal according to a desired channel frequency for generating a modulated signal; and
   a power amplifying circuit coupled to at least one DC-to-DC converter and directly coupled to the external power supply device, such that the power amplifying circuit is configured to receive at least one of voltage levels of the at least one DC-to-DC converter and a supply voltage of the external power supply device for operation of the RF transmitter, for amplifying the modulated signal to generate a RF output signal in response to the received at least one of voltage levels of the at least one DC-to-DC converter and the supply voltage of the external power supply device, the power amplifying circuit comprising:
   a power amplifier having a cascode transistor structure;
   a controllable bias circuit coupled to the cascode transistor structure of the power amplifier;
   an input matching circuit configured to match an input terminal of the power amplifier to an input signal terminal; and
   an output matching circuit configured to match an output terminal of the power amplifier to an output signal terminal;
   wherein a power amplifier control circuit of the power amplifying circuit is configured to increase or decrease resistances of the input matching circuit and the output matching circuit in response to the at least one of voltage levels and the supply voltage of the external power supply device.

2. The RF transmitter of claim 1, wherein the power amplifying circuit further comprises the power amplifier control circuit configured to control the power amplifying circuit based on the at least one of voltage levels and the supply voltage.

3. The RF transmitter of claim 2, wherein a plurality of transistors of the power amplifier are coupled to a main transistor via the cascode transistor structure.

4. The RF transmitter of claim 3, wherein the power amplifier control circuit of the power amplifying circuit adjusts a setting of a bias voltage or a bias current of the controllable bias circuit in response to the at least one of voltage levels and the supply voltage.

5. The RF transmitter of claim 4, wherein the power amplifier comprises a differential amplifier structure.

6. The RF transmitter of claim 3, wherein the power amplifier control circuit of the power amplifying circuit is configured to control the controllable bias circuit, such that the controllable bias circuit is configured to increase or decrease a bias voltage or a bias current of the power amplifier in response to the at least one of voltage levels and the supply voltage, and a turn on number of the transistors of the cascode transistor structure is increased or decreased in response to the at least one of voltage levels and the supply voltage.

7. The RF transmitter of claim 6, wherein the power amplifier comprises a differential amplifier structure.

8. The RF transmitter of claim 1, wherein the power amplifying circuit is coupled to a plurality of DC-to-DC converters for operation.

9. The RF transmitter of claim 1, wherein the power amplifying circuit is coupled to the DC-to-DC converter having controllable output values.

10. The RF transmitter of claim 1, wherein the power amplifying circuit and the DC-to-DC converter are integrated in the RF transmitter.

11. An adaptive power amplifier coupled to at least one direct-current (DC) to direct-current (DC) converter in a radio frequency (RF) transmitter, the adaptive power amplifier comprising:
   a power amplifier having a cascode transistor structure;
   a controllable bias circuit coupled to the cascode transistor structure of the power amplifier;
   an input matching circuit configured to match an input terminal of the power amplifier to an input signal terminal; and an output matching circuit configured to match an output terminal of the power amplifier to an output signal terminal;

wherein the adaptive power amplifier is configured to receive at least one of voltage levels of the at least one DC-to-DC converter and a supply voltage of the external power supply device for operation, such that power amplifier is configured to amplify a modulated signal to generate a RF output signal in response to the received at least one of voltage levels of the at least one DC-to-DC converter and the supply voltage of the external power supply device;

wherein a power amplifier control circuit of the adaptive power amplifier is configured to increase or decrease resistances of the input matching circuit and the output matching circuit in response to the at least one of voltage levels of the at least one DC-to-DC converter and the supply voltage of the external power supply device.

12. The adaptive power amplifier of claim 11, wherein the power amplifier comprises a differential amplifier structure.

13. The adaptive power amplifier of claim 11, wherein the controllable bias circuit is configured to increase or decrease a bias voltage or a bias current of the power amplifier in response to the at least one of voltage levels and the supply voltage, such that a turn on number of transistors of the cascode transistor structure is increased or decreased in response to the at least one of voltage levels and the supply voltage.

14. The adaptive power amplifier of claim 13, wherein the power amplifier comprises a differential amplifier structure.

* * * * *